United States Patent

Deprun

(10) Patent No.: US 7,602,148 B2
(45) Date of Patent: Oct. 13, 2009

(54) METHOD FOR DISPLAYING BATTERY CHARGE LEVELS OF MULTIPLE APPARATUSES

(75) Inventor: Jean-François Deprun, Paris (FR)

(73) Assignee: LG Electronics Inc., Seoul (KR)

( * ) Notice: Subject to any disclaimer, the term of this patent is extended or adjusted under 35 U.S.C. 154(b) by 302 days.

(21) Appl. No.: 11/617,646

(22) Filed: Dec. 28, 2006

(65) Prior Publication Data

US 2007/0152638 A1    Jul. 5, 2007

(30) Foreign Application Priority Data

Dec. 29, 2005    (EP)    ........................ 05292818

(51) Int. Cl.
*H01M 10/46*    (2006.01)
(52) U.S. Cl. ........................................ 320/132
(58) Field of Classification Search ............ 320/106, 320/107, 114, 115, 132, 149; 324/426, 430, 324/433
See application file for complete search history.

(56) References Cited

U.S. PATENT DOCUMENTS

| 5,606,242 A | * | 2/1997 | Hull et al. | .............. 320/106 |
| 5,710,501 A | * | 1/1998 | van Phuoc et al. | .......... 320/106 |
| 6,100,670 A | * | 8/2000 | Levesque | ................ 320/150 |

* cited by examiner

*Primary Examiner*—Edward Tso
(74) *Attorney, Agent, or Firm*—Lee, Hong, Degerman, Kang & Waimey

(57) ABSTRACT

The invention relates to a method for managing charge levels of batteries in apparatuses, comprising the following steps receiving by a master apparatus from a slave apparatus a charge level signal indicative of a level of charge of a battery in the slave apparatus, displaying by the master apparatus a slave charge level information indicative of the level of charge of the battery of the slave apparatus. Particular application for portable electronic apparatuses equipped with rechargeable batteries.

15 Claims, 4 Drawing Sheets

METHOD FOR DISPLAYING BATTERY CHARGE LEVELS OF MULTIPLE APPARATUSES

CROSS REFERENCE TO RELATED APPLICATIONS

Pursuant to 35 U.S.C. § 118(A), this application claims the benefit of earlier filing date and right of priority to European Patent Application No. 05292818.1, filed on Dec. 29, 2005, the content of which is hereby incorporated by reference herein in its entirety.

FIELD OF THE INVENTION

The invention relates to the field of appliances or apparatuses equipped with rechargeable batteries that supply energy to the appliances or apparatuses.

BACKGROUND OF THE INVENTION

With the development of portable electronic apparatuses such as portable computers, portable music players, mobile handsets, mobile headsets, portable game consoles, more and more apparatuses are equipped with rechargeable batteries so that these apparatuses can be stand-alone.

Such apparatuses generally comprise means enabling a user to visualise the charge level of the battery, so that the user is informed of whether the battery is sufficiently charged or not and what approximate operation time remains. Such means may comprise means for measuring the charge level of the battery and an indicator, such as for instance an icon that is displayed on a screen of the apparatus or simply an indicator light, indicative of the state of the battery.

With apparatus having an indicator light, the user only knows the charge level of the battery when this charge level is lower than an alarm level.

A user who has several apparatuses must regularly check all the battery levels in order to be sure that all the apparatuses are sufficiently charged.

SUMMARY OF THE INVENTION

It is an object of the present invention to facilitate the checking of the battery charge levels.

In order to achieve the above-mentioned object, a method for managing charge levels of batteries in apparatuses including: receiving by a master apparatus from a slave apparatus a charge level signal indicative of a level of charge of a battery in the slave apparatus; and displaying by the master apparatus a slave charge level information indicative of the level of charge of the battery of the slave apparatus.

According to the present invention, the battery charge levels of several slave apparatuses can be displayed on a unique interface, on a master apparatus, so that the user can visualize the battery charge levels of all the apparatuses very easily and quickly.

The user can choose a master product among his apparatuses.

In order to achieve the above-mentioned object, a method for managing charge levels of batteries in apparatuses including: transmitting, from a slave apparatus to a master apparatus, a charge level signal indicative of a level of charge of a battery in said slave apparatus, and displaying by the master apparatus a slave battery charge level information indicative of the level of charge of the battery of the slave apparatus.

The invention finally provides a software product loadable into a master apparatus and a software product loadable into slaves apparatuses in order to perform the method for managing charge levels of batteries.

Slave apparatuses and master apparatus can communicate via a wireless protocol in order to perform the method of the invention.

BRIEF DESCRIPTION OF THE DRAWINGS

The invention will be described with reference to the drawings, in which.

DESCRIPTION OF PREFERRED EMBODIMENTS

Figure 1:
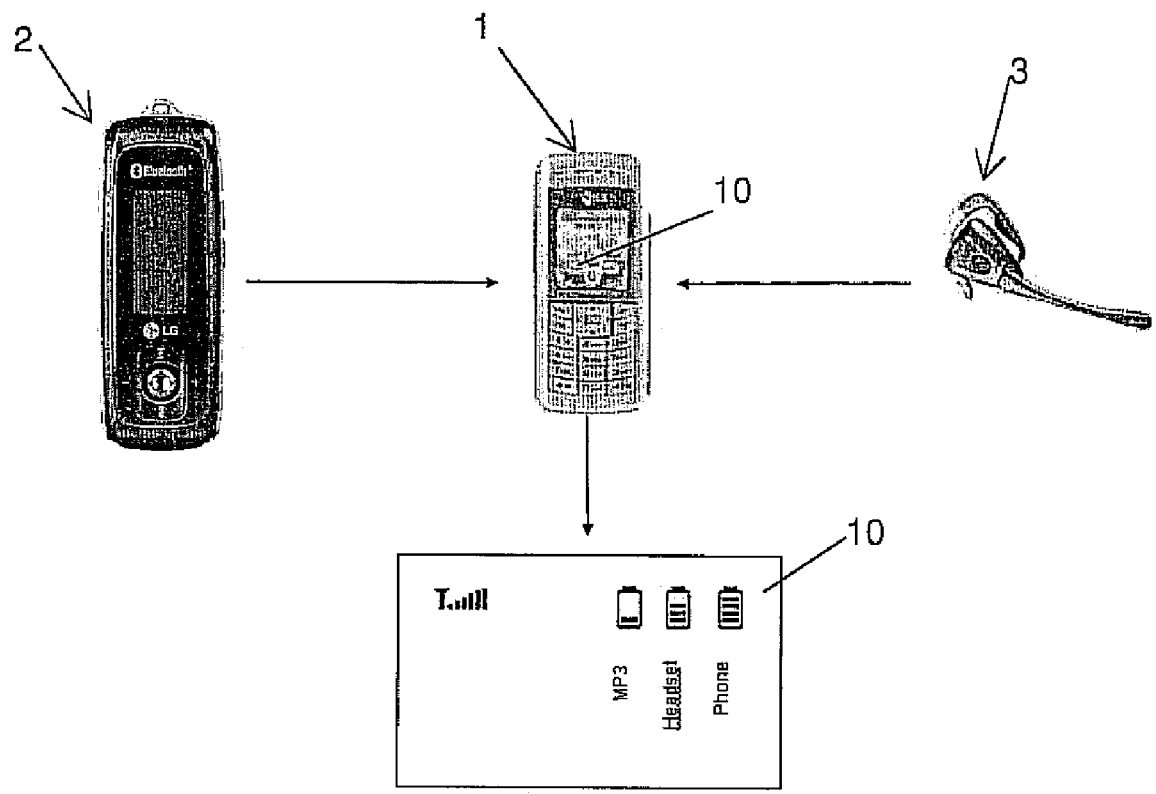
FIG. 1 diagrammatically shows different apparatuses that can be used in order to implement a method for managing battery charge levels according to an embodiment of the invention, FIG. 2 diagrammatically shows the steps performed by a master apparatus in a method for managing battery charge levels according to an embodiment of the invention, FIG. 3 diagrammatically shows the steps performed by a slave apparatus in a method for managing battery charge levels according to an embodiment of the invention, FIG. 4 diagrammatically shows the signals exchanged between a master apparatus and a slave apparatus during the beginning of the managing of a battery charge level procedure, FIG. 5 diagrammatically shows the signals exchanged between a master apparatus and a slave apparatus during the end of the managing of a battery charge level procedure.

FIG. 1 diagrammatically shows apparatuses that can be used to implement a method for managing battery charge levels.

The apparatuses comprise for instance cellular mobile phone 1, a MP3 player 2 and a headset 3 which belong to a same user. The user can select a master product among his apparatuses.

For instance, the cellular mobile phone 1 is the master apparatus whereas the MP3 player 2 and the headset 3 are slave apparatuses.

Each apparatus 1, 2 and 3 comprises a rechargeable battery as an energy supply.

The master apparatus 1 comprises wireless communication means, such as radio, optical or infrared transceiver means.

Each slave apparatus 2 and 3 also comprises wireless communication means for communicating with the master apparatus 1 according to a wireless protocol, such as a Bluetooth or WiFi protocol.

The master apparatus 1 comprises a screen 10 in order to display information regarding battery charge levels of the apparatus 1, 2 and 3.

Figure 2:
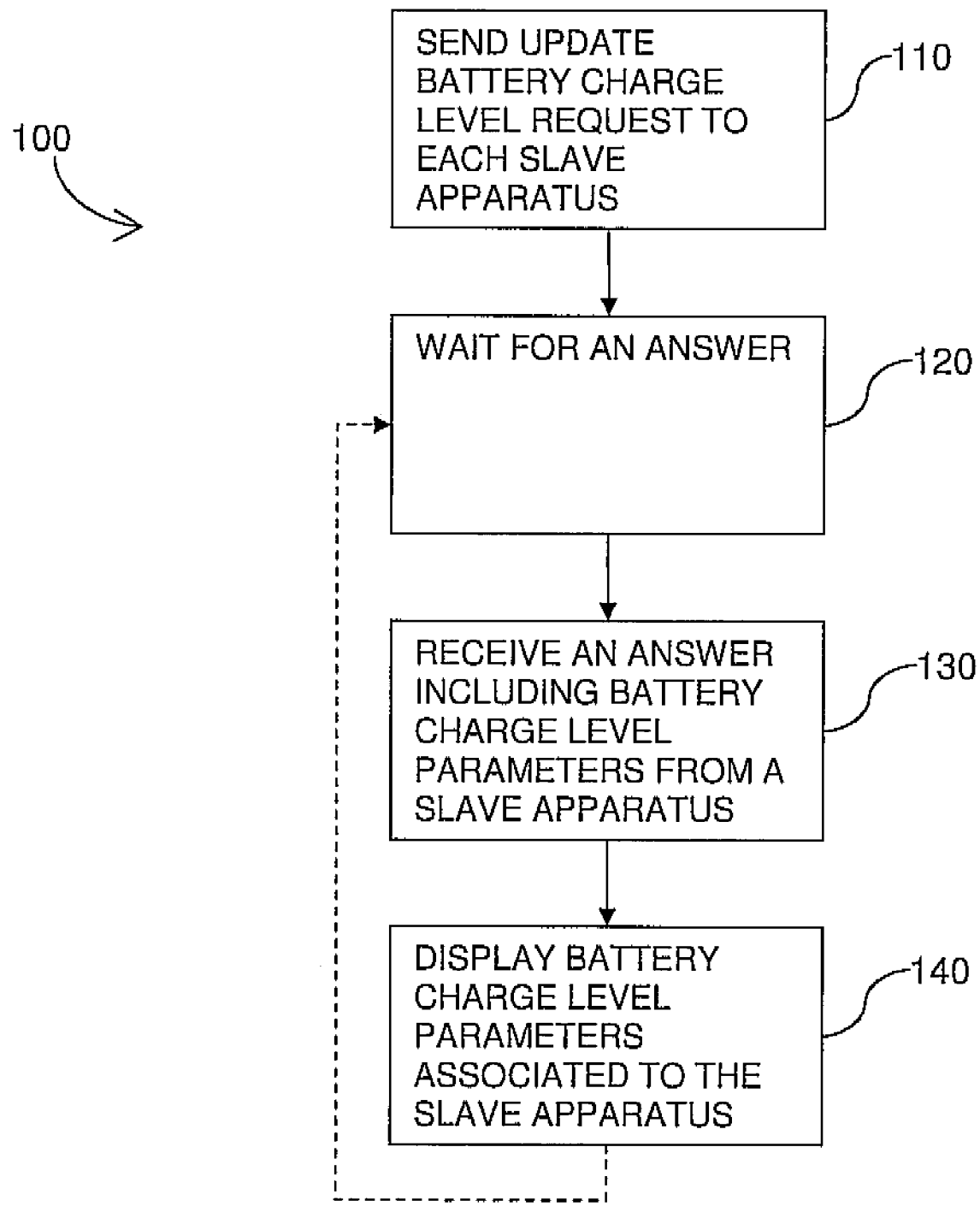

FIG. 2 diagrammatically shows the steps performed by a master apparatus in a method for managing battery charge levels according to an embodiment of the invention.

The master apparatus 1 is programmed for performing the method for managing battery charge levels To this end, the master apparatus includes a Symbian OS application software (master application software) that can be launched by the user. Thus, the master apparatus 1 is initialized by the user.

In one embodiment of the invention, the master application software can automatically be launched when the master apparatus is turned on.

According to a first step 110, the master apparatus transmits a request signal to each slave apparatuses. By transmitting the request signal, the master apparatus requests that the slave apparatus indicates the charge level of its own battery.

According to a second step 120, the master apparatus waits for an answer from the slave apparatus.

According to a third step 130, the master apparatus receives an response signal from the slave apparatus. The response signal comprises battery charge level parameters. The battery charge level parameters can comprise for instance one or several among an index indicative of the charge level, a percentage of charge, a remaining time of range (in an idle mode or in a functioning mode) or a time necessary for completely charging the apparatus.

According to a fourth step 140, upon receiving the response signal from the slave apparatus, the master apparatus displays information on the level of charge of the battery of the slave apparatus on a display screen.

As illustrated on FIG. 1, the master apparatus displays on the same screen, information regarding battery charge levels of several apparatuses 1, 2 and 3. The information can be presented to the user as icons, each icon being associated to a particular apparatus and symbolizing the charge level of the battery of the apparatus.

Names of the different apparatuses (including the master apparatus) are displayed next to the icons, such that each name is associated to one of the icons.

Some additional information can be displayed, such as other charge level parameters, for instance an index indicative of the charge level, a percentage of charge, a remaining time of range (in an idle mode or in a operating mode) or a time necessary for completely charging the apparatus.

Moreover, the colour of the icons can be changes according to the level of charge of the batteries.

For instance, when the battery of a slave apparatus is full, the associated icon can be blue, whereas, when the charge battery is low, the associated icon can be red.

According to an embodiment of the invention, the master apparatus goes back to the second step 120, waiting for an update answer from the slave apparatus.

Figure 3:
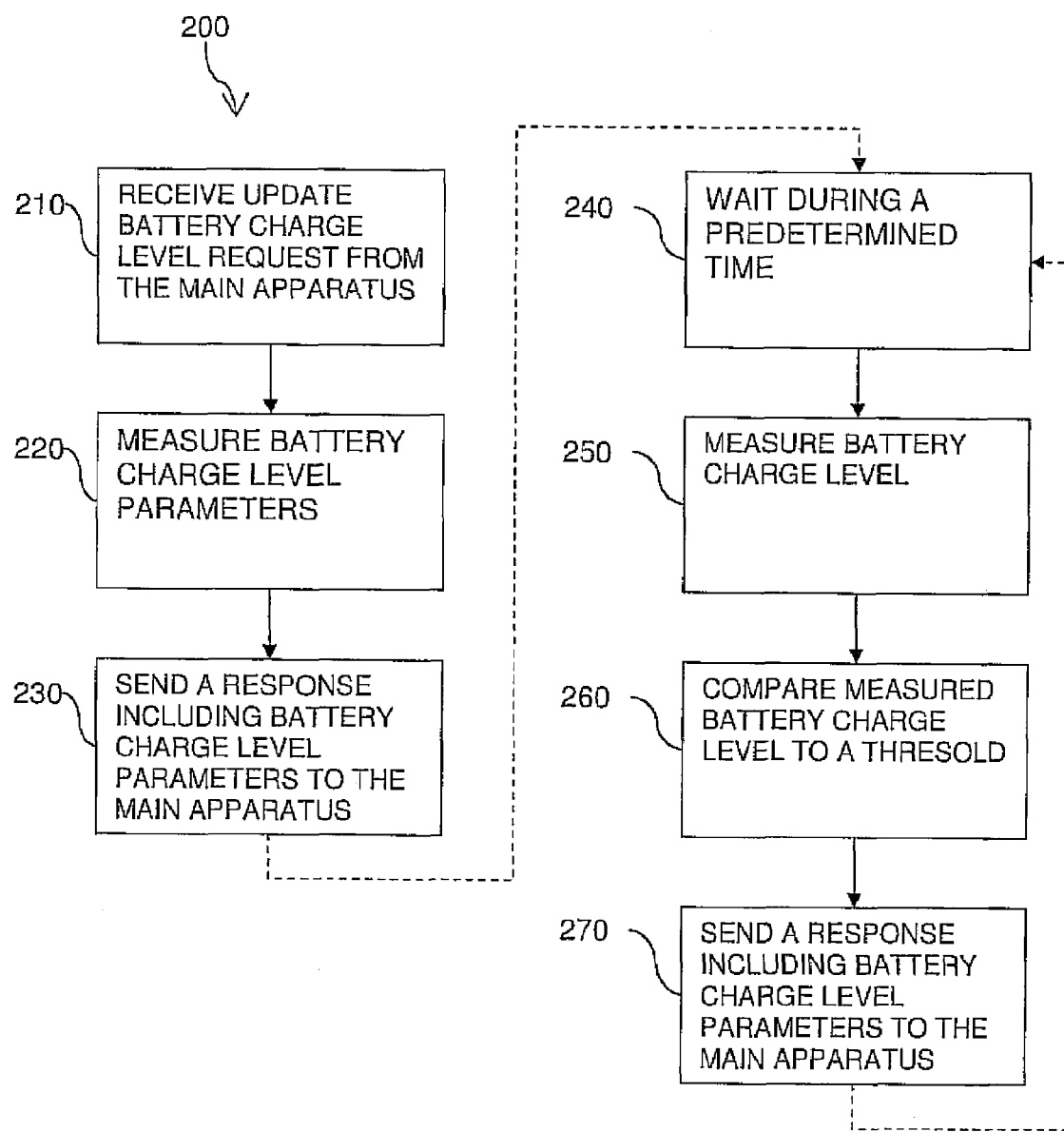

FIG. 3 diagrammatically shows the steps performed by a slave apparatus in a method for managing battery charge levels according to an embodiment of the invention.

Each slave apparatus 2 or 3 is programmed for performing the method for managing battery charge levels. To this end, the slave apparatus includes a Symbian OS application software (slave application software) that is launched upon reception of request signal transmitted by the master apparatus 1 by the slave apparatus. Thus, each slave apparatus is initialized by the master apparatus 1.

According to a first step 210, the slave apparatus receives a request signal from the master apparatus. The request signal is adapted to be identified by the slave apparatus.

According to a second step 220, the slave apparatus measures a charge level of its battery.

According to a third step 230, the slave apparatus transmits a response signal to the master apparatus. The response signal comprises battery charge level parameters. As already mentioned, the battery charge level parameters can comprise for instance an index indicative of the charge level, a percentage of charge, a remaining time of range (in an idle mode or in a functioning mode) or a time necessary for completely charging the apparatus.

Then according to an embodiment of the invention, the slave apparatus performs the following steps.

According to a fourth step 240, the slave apparatus waits during a predetermined time.

According to a fifth step 250, the slave apparatus measures a charge level of its battery.

According to a sixth step 260, the slave apparatus compares the measured charge level to one or more threshold(s).

According to a first possibility, the thresholds can comprise a sequence of predetermined fixed reference charge levels (for instance thresholds corresponding to 25%, 50% and 75% of a maximum charge of the battery).

If the charge level falls below one of the predetermined reference thresholds, the slave apparatus transmits a response signal to the master apparatus.

According to a second possibility, the threshold can be determined according to a previous measured level of charge.

If the difference between the current measured charge level and the previous measured charge level is greater than a predetermined variation, the slave apparatus transmits a response signal to the master apparatus.

According to a seventh step 270, the slave apparatus transmits an update response signal to the master apparatus.

Then, the slave apparatus goes back to the fourth step 240, so that steps 240 to 270 are periodically repeated. The slave apparatus periodically measures a charge level of the battery and automatically transmits update response signals to the master apparatus.

Figure 4:
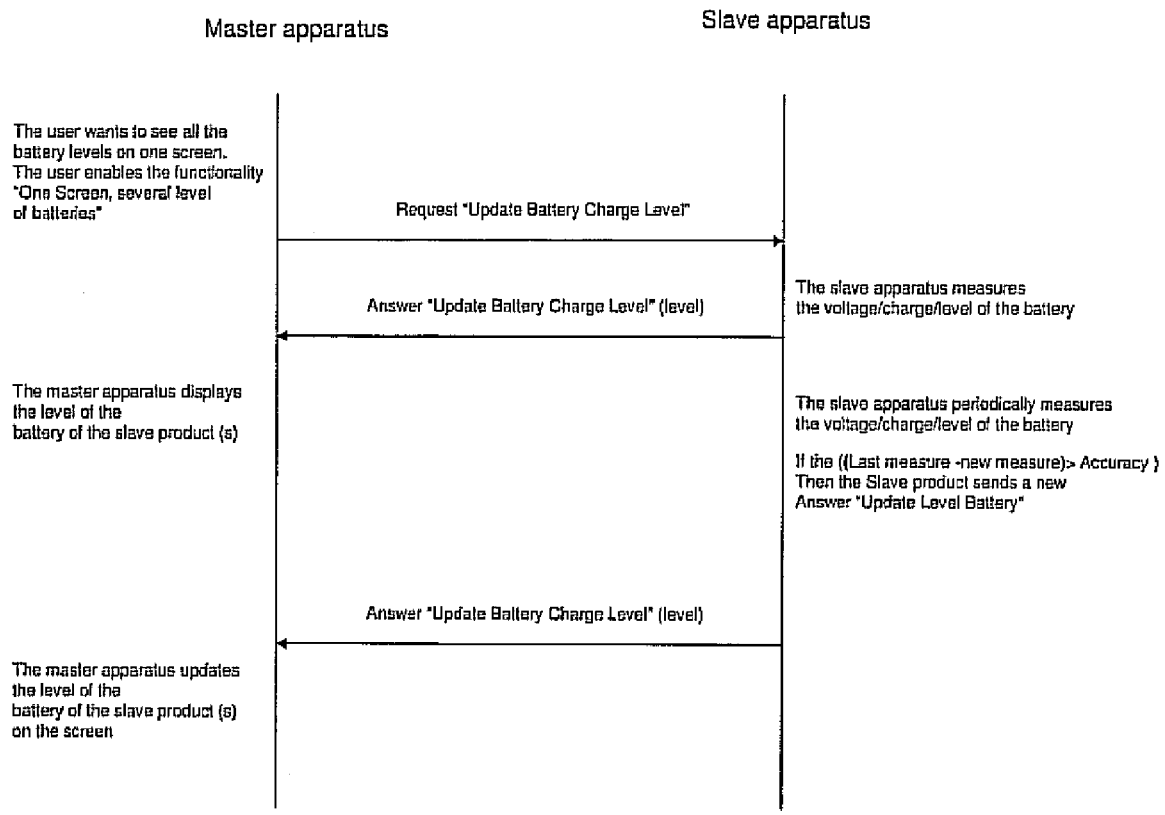

FIG. 4 diagrammatically shows the signals exchanged between a master apparatus and a slave apparatus during the beginning of the managing of a battery charge level procedure.

As can be seen on this figure, the master apparatus initializes the procedure by transmitting a first request signal.

Then, the slave apparatus periodically transmits answer signals to the master apparatus, in order that the master apparatus updates the displayed battery charge levels.

Figure 5:
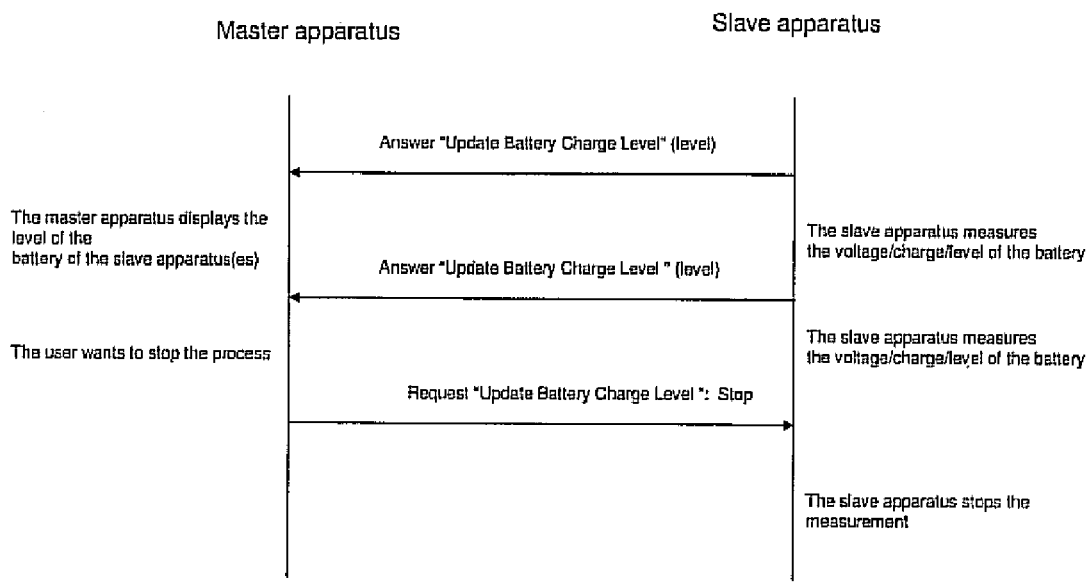

FIG. 5 diagrammatically shows the signals exchanged between a master apparatus and a slave apparatus during the end of the managing of a battery charge level procedure.

When the user decides to stop the procedure, the user keys in the master apparatus an order indicating that he wants stop the procedure. To this end, the user can simply close the master application software running on the master apparatus.

Then, the master apparatus transmits a stop request signal to each slave apparatus. Upon reception of the stop request signal, each slave apparatus closes the slave application software.

The invention claimed is:

1. A method for displaying battery charge levels, the method comprising:
    receiving via wireless communication by a master apparatus from a slave apparatus a charge level signal indicative of a level of charge of a battery in the slave apparatus, the battery in the slave apparatus serving as an energy supply for the slave apparatus;
    displaying by the master apparatus a slave charge level information indicative of the level of charge of the battery of the slave apparatus; and
    displaying by the master apparatus a master charge level information indicative of a level of charge of a battery in the master apparatus, the battery in the master apparatus serving as an energy supply to the master apparatus.

2. The method according to claim 1, wherein the master apparatus displays levels of charge of a plurality of slave apparatuses.

3. The method according to claim 1, comprising an initialization step which transmits a request to the slave apparatus for obtaining the charge level signal in the master apparatus.

4. The method according to claim 3, wherein the initialization step is automatically performed when the master apparatus is turned on.

5. The method according to one of claim 3, wherein the master apparatus periodically transmits said request to the slave apparatus.

6. The method according to claim 1, further comprising the step of determining at the master apparatus a time interval between two successive requests as a function of the variation of the level of charge of the battery of the slave apparatus.

7. The method according to one of claim 1, wherein said charge level signal comprises at least one charge level parameter among an index indicative of the charge level, a percentage of charge, a remaining time of range in an idle mode, a remaining time of range in an operating mode or a time needed for completely charging the slave apparatus battery.

8. The method according to one of claim 1, wherein the display of said slave charge level information by the master apparatus comprises an icon symbolizing the level of charge.

9. A method for displaying battery charge levels, the method comprising:
   wirelessly transmitting, from a slave apparatus to a master apparatus, a charge level signal indicative of a level of charge of a battery in the slave apparatus, the battery in the slave apparatus serving as an energy supply for the slave apparatus;
   displaying by the master apparatus a slave battery charge level information indicative of the level of charge of the battery of the slave apparatus; and
   displaying by the master apparatus a master charge level information indicative of a level of charge of a battery in the master apparatus, the battery in the master apparatus serving as an energy supply to the master apparatus.

10. The method according to claim 9, further comprising an initialization step which receives a request from the master apparatus for transmission of said charge level signal to said master apparatus.

11. The method according to claim 10, further comprising a step which measures the level of charge of the battery in the slave apparatus.

12. The method according to claim 11, further comprising a step which compares the measured level of charge of the battery in the slave apparatus to one or more threshold(s) of the slave apparatus, and transmits or not an update signal to the master apparatus according to the comparison.

13. The method according to claim 12, wherein the slave apparatus compares the measured level of charge of the battery in the slave apparatus to a fixed reference charge level.

14. The method according to claim 12, wherein the slave apparatus compares the measured level of charge of the battery in the slave apparatus to a threshold which depends on a previously measured charge level.

15. The method according to one of claim 9, wherein the charge level signal comprises at least one charge level parameter among an index indicative of the charge level, a percentage of charge, a remaining time of range in an idle mode, a remaining time of range in a functioning mode or a time necessary for completely charging the slave apparatus battery.

* * * * *